US011430905B1

(12) United States Patent
Kaliski et al.

(10) Patent No.: US 11,430,905 B1
(45) Date of Patent: Aug. 30, 2022

(54) HETERO-JUNCTION PHOTOTRANSISTOR

(71) Applicant: Ball Aerospace & Technologies Corp., Boulder, CO (US)

(72) Inventors: Robert Kaliski, Boulder, CO (US); Robert G. Marshalek, Superior, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 9 days.

(21) Appl. No.: 16/834,130

(22) Filed: Mar. 30, 2020

Related U.S. Application Data

(60) Provisional application No. 62/826,440, filed on Mar. 29, 2019.

(51) Int. Cl.
| | | |
|---|---|---|
| *H01L 31/062* | (2012.01) | |
| *H01L 31/113* | (2006.01) | |
| *H01L 29/66* | (2006.01) | |
| *H01L 31/0304* | (2006.01) | |
| *H01L 29/778* | (2006.01) | |
| *H01L 29/20* | (2006.01) | |

(52) U.S. Cl.
CPC ...... *H01L 31/1136* (2013.01); *H01L 29/2003* (2013.01); *H01L 29/66462* (2013.01); *H01L 29/778* (2013.01); *H01L 31/03048* (2013.01)

(58) Field of Classification Search
CPC ............ H01L 31/1136; H01L 29/2003; H01L 29/66462; H01L 29/778; H01L 31/03048
USPC ................................................. 257/292, 294
See application file for complete search history.

(56) References Cited

U.S. PATENT DOCUMENTS

| | | | | |
|---|---|---|---|---|
| 6,552,374 B2* | 4/2003 | Han | ................... | H01L 29/66287 257/197 |
| 6,727,153 B2* | 4/2004 | Chow | ................... | H01L 29/155 257/197 |
| 6,767,797 B2* | 7/2004 | Krutsick | ........... | H01L 21/82285 257/E21.375 |
| 7,378,690 B2* | 5/2008 | Kurokawa | .......... | H01L 29/0657 257/197 |
| 7,576,409 B1* | 8/2009 | Chen | ................... | H01L 27/0605 257/197 |

OTHER PUBLICATIONS

Choi et al. "Gain-Enhanced InGaAs-InP Heterojunction Phototransistor With Zn-Doped Mesa Sidewall," IEEE Photonics Technology Letters, Sep. 2009, vol. 21, No. 17, pp. 1187-1189.

(Continued)

*Primary Examiner* — Tan N Tran
(74) *Attorney, Agent, or Firm* — Sheridan Ross P.C.

(57) ABSTRACT

A hetero-junction phototransistor with a first layer comprising an InP N buffer and substrate, a second layer comprising an InGaAs N collector on the InP N buffer and substrate, a plurality of InGaAs P bases on the InGaAs N collector layer, and a plurality of InAlAs N emitters is described. Each emitter of the plurality of InAlAs N emitters is on a different base of the plurality of InGaAs P bases. The hetero-junction phototransistor comprises a plurality of InGaAs N+ caps, wherein each cap of the plurality of InGaAs N+ caps is on a different emitter of the plurality of InAlAs N emitters. The hetero-junction phototransistor comprises one or more electrical contacts. Each of the one or more electrical contacts is on a different cap of the plurality of InGaAs N+ caps.

10 Claims, 10 Drawing Sheets

(56) References Cited

OTHER PUBLICATIONS

Park et al. "Surface passivation and aging of InGaAs/InP heterojunction phototransistors," Journal of Applied Physics, 2017, vol. 121, article 233105, 8 pages.
Rezaei et al. "Heterojunction phototransistor for highly sensitive infrared detection," Proceedings of SPIE, 2017, vol. 10177, article 1017710, 7 pages.
THEN "The Transistor Laser: Theory and Experiment," Proceedings of the IEEE, 2013, vol. 101, No. 10, pp. 2271-2298.

* cited by examiner

HETERO-JUNCTION PHOTOTRANSISTOR

CROSS REFERENCE TO RELATED APPLICATION

The present application claims the benefits of and priority, under 35 U.S.C. § 119(e), to U.S. Provisional Application Ser. No. 62/826,440, filed Mar. 29, 2019, entitled "HETERO-JUNCTION PHOTOTRANSISTOR," which is incorporated herein by this reference in its entirety for all that it teaches and for all purposes.

FIELD

The present disclosure is generally directed to a phototransistor and, in particular, toward a heterojunction phototransistor.

BACKGROUND

Phototransistors have long been recognized as having advantages in photodetection. Gain is an important factor in the design of any transistor. Over the last decade, phototransistor arrays have been developed for low light applications. Such contemporary arrays are enabled by passivated surfaces with high dielectric constant, high k, materials to minimize noise currents and allow the creation of small feature mesa structures, e.g., ~10 microns. Currently, some producers of phototransistors offer phototransistor arrays, known as heterostructure phototransistors (HPTs) or photon counting integrated circuits (PCIC) that show current gains of ~200 and frequency bandwidths of 1 GHz for 100 micron×200 micron devices. FIG. 2 shows a cross-section of a typical mesa phototransistor proposed. The structure of the conventional phototransistor of FIG. 2 has Zn-diffused mesa side walls along with atomic layer epitaxial (ALE), high-k dielectric to achieve such gain in a P-N-P transistor. In this case, the Zn-diffusion creates an effectively buried base due to the depletion region.

In the conventional phototransistor illustrated in FIG. 3, the side wall has the same doping as the base but is electrically isolated. An NPN structure is generally preferred, given the higher mobilities of electrons leading to higher frequency response.

The optical gain is important in determining sensitivity, given that the gain can overcome other noise contributions in order to reach the shot noise limit. These contributions include primarily shot noise from background sources, thermal noise, and electronic amplifier noise such as transimpedance amplifiers (TIAs), and dark current. In past work, the high dark current has limited the usefulness of such devices. In fact, some conventional devices only show improved sensitivity compared to a PIN device at data rates >~500 Mbit/s due to high dark current coupled with relatively low measured gain (~20).

In conventional phototransistors, some type of passivation is required for such mesa HPT structures, but it does appear that no conventional technique is able to match the dark current of simple photodiodes. A higher dark current can be tolerated if the gain is sufficient to overcome this noise contribution.

What is needed is a high frequency phototransistor with little to no dark current.

BRIEF DESCRIPTION OF THE DRAWINGS

The following detailed description of certain embodiments of the present disclosure may be understood by reference to the following figures.

Figure 1:
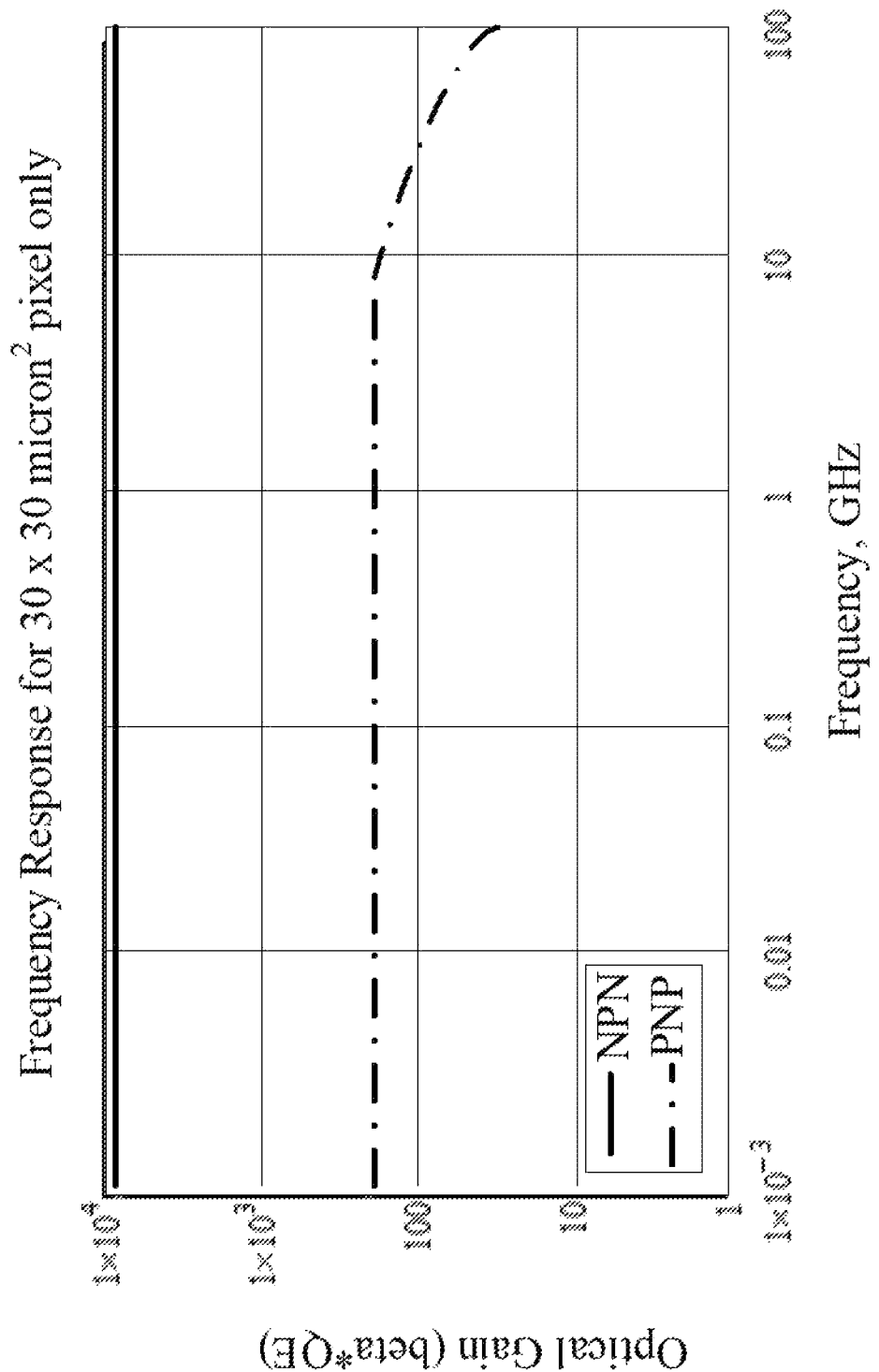
FIG. 1 shows a graph of frequency response for a 30×30 micron pixel.

While the invention has been described in connection with certain preferred embodiments, other embodiments would be understood by one of ordinary skill in the art and are encompassed herein.

DETAILED DESCRIPTION

The present disclosure describes a high frequency phototransistor with little to no dark current. The problems with contemporary transistors as discussed above may be solved through technical means as described herein.

The following detailed description refers to the accompanying drawings that show, by way of illustration, details and embodiments in which the invention may be practiced. These embodiments are described in sufficient detail to enable those skilled in the art to practice embodiments of the present invention. Other embodiments may be utilized, and structural, logical, and electrical changes may be made without departing from the inventive subject matter. The various embodiments disclosed herein are not necessarily mutually exclusive, as some embodiments can be combined with one or more other embodiments to form new embodiments. The following detailed description is, therefore, not to be taken in a limiting sense.

Phototransistors have long been recognized as having advantages in photodetection. In this application, a transistor, a 3-terminal device with a floating base, absorbs photons in the base leading to a base current. Similar to P-Intrinsic-N (PIN) photodiodes, photons absorbed internally to the device create a current, but phototransistors provide current gain due to minority carrier injection from the emitter to the base caused by the additional base charge. Similar to APDs, the current created is multiplied, but in phototransistors the gain is uniform based on the voltage bias (e.g., less than five volts ("V") as compared to greater than 55 V for an APD) and has no excess noise. The current generated by photon detection, $I_{ph}$, in a phototransistor in the design limit is $$I_{ph} = \frac{q}{h\nu}\eta\beta_f P,$$

where q is the electron charge, hv is the energy per photon, η is the external quantum detection efficiency, and $\beta_f$ is the current gain from base to collector (in common emitter mode, with maximum at 0 Hz of ($\beta_{dc}$). Historically, devices have not received commercial application due to gain roll-off at high frequencies (typically less than one GHz), high dark current noise, and inability to make small feature size devices. For efficient devices, heterojunction bipolar transistors are more demanding in fabrication than PINs and APDs. Phototransistors have long been recognized as having advantages in photodetection. Gain is an important factor in the design of any transistor. For a phototransistor, gain is represented as $\beta_{dc}$. For homojunction transistors, the gain value for an N-P-N structure can be calculated using the following formula:

$$\beta_{dc} = \frac{1}{\cosh\left(\frac{w_{base}}{L_{pbase}}\right) + \frac{D_{pemitter}L_{pbase}n_{emitter}}{D_{nbase}L_{nemitter}n_{base}} * \sinh\left(\frac{w_{base}}{L_{pbase}}\right) - 1},$$

where $w_{base}$ represents the width of the base, $L_{pbase}$ and $L_{nemitter}$ represent the minority carrier diffusions, $D_{nemitter}$ and $D_{pbase}$ represent the diffusion constants for the majority carrier in the emitter and $n_{emitter}$ and $n_{base}$ represent the donor and acceptor carrier concentrations in the emitter and the base. The cosh and sinh are hyperbolic cosine and sine functions, respectively.

Assuming the base width (typically 100 nm for InGaAs/InP) is much less than the minority carrier diffusion length, usually less than 1000 nm, and that $np=n_i^2$, then the above formula reduces to $$\beta_{dc} \approx \frac{D_{nbase}L_{nemitter}N_{Demitter}}{D_{pemitter}w_{base}N_{Abase}},$$

where $N_{Demitter}$ and $N_{Abase}$ represent the donor and acceptor carrier concentrations. This expression can be further simplified to the following, using the relation $L=\sqrt{D\tau}$, where τ represents the recombination lifetime:

$$\beta_{dc} \approx \frac{L_{nbase}^2 N_{Demitter} \tau_{pemitter}}{L_{pemitter}w_{base}N_{Abase}\tau_{nbase}}.$$

These values can also be determined from mobility, μ, data and the Einstein relation, $$D = \mu kT/q,$$

but it is often easier to find data as a function of carrier concentration for the diffusion length and lifetime, than the diffusion constant.

The expressions above limits the gain of a transistor, particular for high-speed operation. The heterostructure bipolar transistor overcomes this limitation given the expressions are modified to $$\beta_{dc} \approx \frac{L_{nbase}^2 N_{Demitter} \tau_{pemitter}}{L_{pemitter}w_{base}N_{Abase}\tau_{nbase}} e^{\frac{\Delta E_g}{k_B T/q}}$$

for a graded emitter-base heterojunction, where $\Delta E_g$ is the difference in bandgaps, $k_B$ is Boltzmann's constant and T is the temperature in Kelvin. This modification is a consequence of the intrinsic carrier concentrations being different for different bandgap materials and the law of mass action ($n*p=n_i^2$). For the case of an abrupt heterojunction, the energy difference is now just the conduction band difference for an N-P-N structure. For a P-N-P structure, the formulation is the same with the replacement of the emitter and base carrier types and an adjustment to the valence band difference for the abrupt junction.

Given $k_BT/q$ is 0.026 eV, a bandgap difference of 0.34 eV for an abrupt $In_{0.53}Ga_{0.47}As/InP$, and using literature values for minority carrier diffusion lengths and recombination lifetimes [8,9] we calculate $\beta_{dc} \sim 4 \times 10^6$. This estimate includes corrections to the diffusion lengths that match historically accepted values for intrinsic $In_{0.53}Ga_{0.47}As$, $\mu_n \sim 10{,}000$ cm$^2$/V-s and $\mu_p \sim 250$ cm$^2$/V-s. Similar calculations for an PNP structure with an abrupt junction, however, lead to $\beta_{dc} \sim 430$. While significantly lower than the NPN device, both values are much larger than for APDs, which are usually in the range of 10 to 50 and also exhibit excess noise. Note, a graded heterojunction could produce larger β in both structures, but it is more difficult in the InGaAs/InP system to produce graded junctions due to the lattice mismatch.

The frequency response of a phototransistor determines the current gain at the frequency of interest. Heterojunction bipolar transistors typically have very high, 100 GHz or more, bandwidth due to ability to tailor the base doping to high levels without a significant impact to the current gain. The acquisition and tracking bandwidths typically do not stress the operation of photodiodes as they are less than 20 kHz. We, however, also want to operate these devices at typical communications bandwidths, which are of the order of 0.05 to 10-100 GHz for modern communications protocols. Using a hybrid-p model for a bipolar transistor, the cutoff frequency is typically $$f_{max} = \sqrt{\frac{f_t}{8\pi r_{base}C_{collector}}} \text{ where } f_t = \frac{1}{2\pi \tau_{base}} = \frac{L_{pbase}^2}{\pi w_{base}^2 \tau_{pbase}}$$

with the base transit time converted using that fact it is equal to the $D_p/w_{base}^2$, and $r_{base}$ and $C_{collector}$ are the base series resistance and the collector capacitance. Assuming a 30×30 micron$^2$ pixel with an N-P-N structure on an N-type InP substrate of 625 microns thick with a mobility of 2000 cm$^2$/V-s, the $f_{max}$ is >>100 GHz (>700 GHz, but probably limited by other parasitics), while the PNP device is 18 GHz. Given that maximum frequency is where the value goes to 3 dB of its DC value, we do not observe a gradual decrease in β until over 1 GHz in both structures and no roll-off for the NPN structure. Here, a full series resistance of the structure may be assumed but did additional package parasitic impedances, which will further decrease the response, may not be included. The graph of FIG. 1 shows the frequency response for optical gain in NPN and PNP devices. The initial indications, however, are that NPN devices will not suffer from drops in optical gain over the frequencies of interest.

Over the last decade, phototransistor arrays have been developed for low light applications. These arrays are enabled by passivated surfaces with high dielectric constant, high k, materials to minimize noise currents and allow the creation of small feature mesa structures, ~10 microns.

Figure 2:
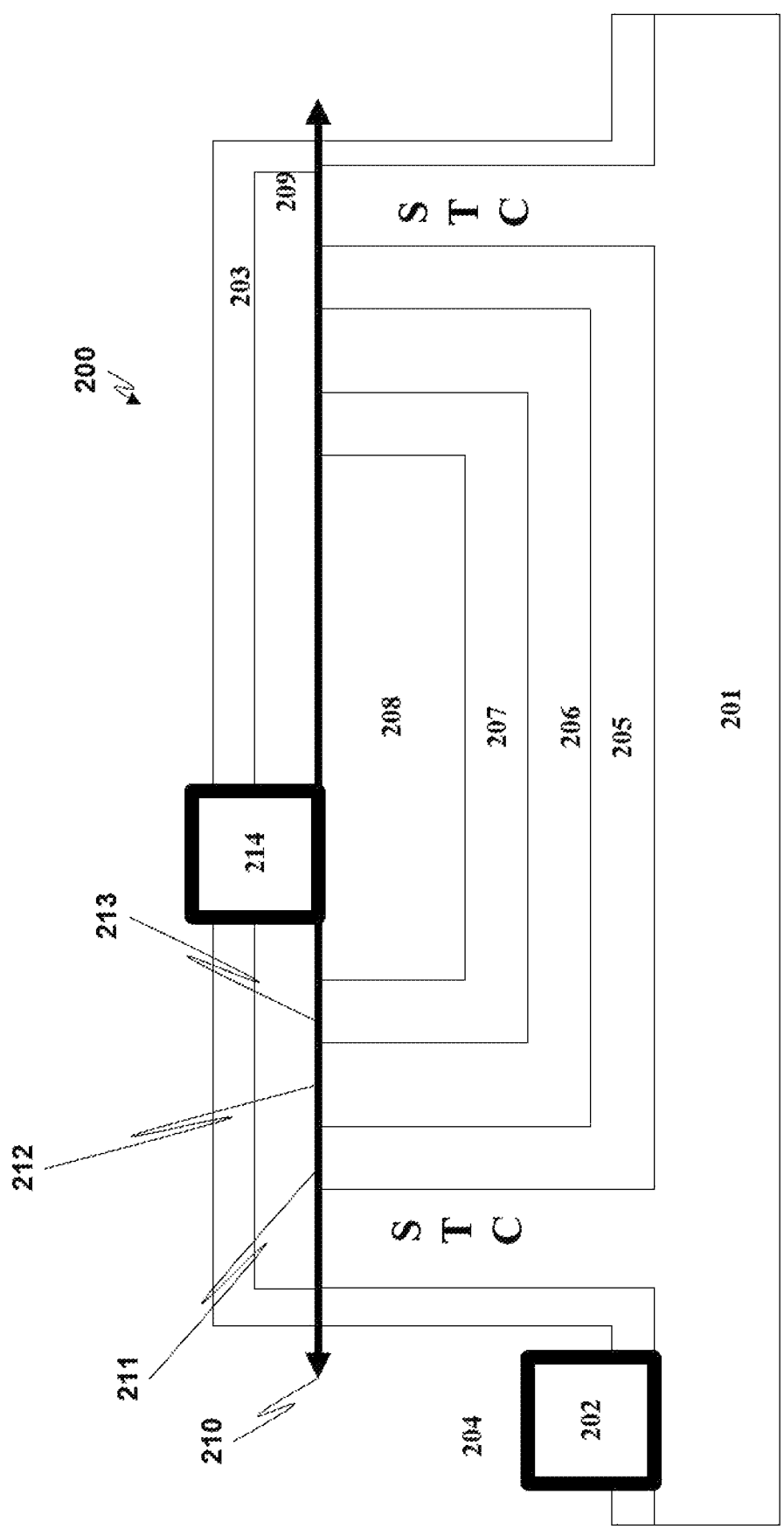
FIG. 2 shows a conventional phototransistor.

Currently, some producers of phototransistors offer phototransistor arrays, known as heterostructure phototransistors (HPTs) or photon counting integrated circuits (PCIC) that show current gains of ~200 and frequency bandwidths of 1 GHz for 100 micron×200 micron devices. FIG. 2 shows a cross-section of a typical mesa phototransistor proposed. The structure of the conventional phototransistor of FIG. 2 has Zn-diffused mesa side walls along with atomic layer epitaxial (ALE), high-k dielectric to achieve such gain in a P-N-P transistor. In this case, the Zn-diffusion creates an effectively buried base due to the depletion region.

The conventional phototransistor 200 of FIG. 2 includes a p-doped InGaAs/InP collector on an InP substrate 201. A collector ohmic contact 202 connects the collector through a $SiN_x$ layer 203 to an isolation trench 204. A collector p-n or p-i-n junction 205 is disposed on the InGaAs/InP collector and InP substrate 201. An n-doped InGaAs base 206 is disposed on the collector junction 205. An emitter p-n or p-i-n junction 207 is disposed on the base 206. An STC p-doped InP emitter 208 is disposed on the emitter junction 207. A passivating ALD Al2O3 layer 209 lies between the emitter 208 and the $SiN_x$ layer 203 and above a mesa surface 210. At the mesa surface 210, a collector junction 211, a base 212, and an emitter junction 213 may be accessible for contact. Similarly, an emitter ohmic contact 214 may be disposed on the emitter 208 and may traverse the mesa surface 210, the passivating ALD Al2O3 layer 209, and the $SiN_x$ layer 203.

Figure 3:
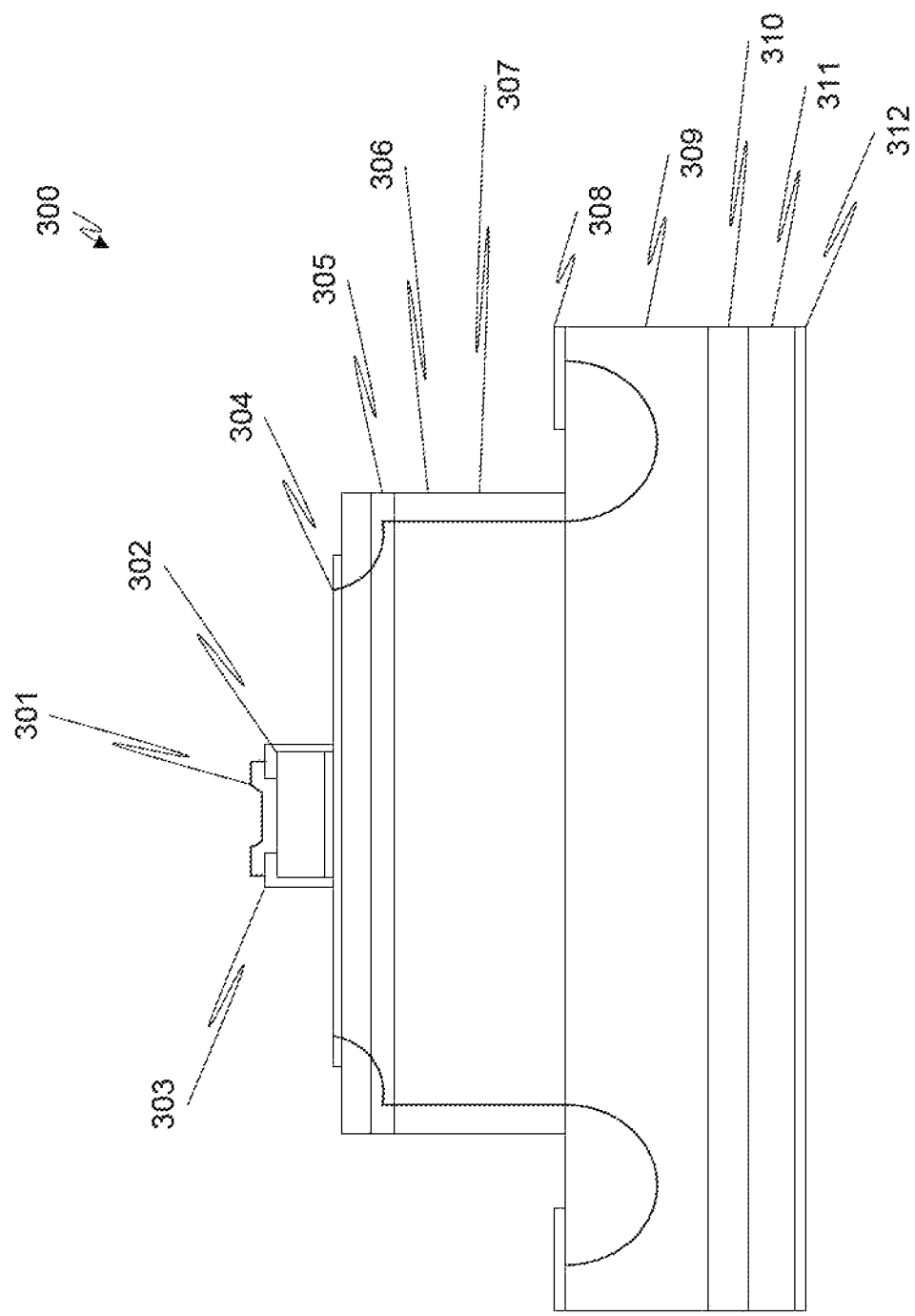
FIG. 3 shows a conventional phototransistor.

In the conventional phototransistor 300 illustrated in FIG. 3, the side wall has the same doping as the base but is electrically isolated. An NPN structure may generally be preferred given the higher mobilities of electrons leading to higher frequency response. In the conventional phototransistor 300 of FIG. 3, an emitter electrode 301 typically comprises one or a combination of Ti, Pt, Au and is disposed on an emitter contact layer 302 comprising N—InGaAs and is typically around 300 nm in depth. A step-graded layer 303 surrounds the emitter contact layer 302 and comprises N—InGaAsP and is typically around 50 nm in depth. The emitter contact layer 302 is disposed on an intrinsic emitter and/or ledge 304 which is typically around 200 nm of InP. The emitter contact layer 302 is disposed on a base 305 of 100 nm of P—InGaAs which is disposed on a Zn-diffused layer 306. The conventional phototransistor 300 comprises a collector/photo-absorber 307 of 1500 nm of N—InGaAs, an SiNx contact 308 of 200 nm, an N⁻ InP layer 309 of 2000 nm, an N—InP layer 310 of 500 nm, an InP substrate 311, and a collector electrode 312.

The optical gain is important in determining sensitivity, given that the gain can overcome other noise contributions in order to reach the shot noise limit. These contributions include primarily shot noise from background sources, thermal noise, and electronic amplifier noise such as transimpedance amplifiers (TIAs), and dark current. In contemporary designs, the high dark current has limited the usefulness of such devices. In fact, some conventional devices only show improved sensitivity compared to a PIN device at data rates >~500 Mbit/s due to high dark current coupled with relatively low measured gain (~20).

In conventional phototransistors, some type of passivation is required for mesa HPT structures, but no conventional technique is able to match the dark current of simple photodiodes. A higher dark current can be tolerated if the gain is sufficient to overcome this noise contribution. What is needed then is a high frequency phototransistor with little to no dark current.

Embodiments of the present disclosure will be described in connection with a heterojunction phototransistor. Conventional phototransistors include NPN structures using a Zn-diffused mesa side wall with an estimated beta of 9420. In such structures, a side wall has the same doping as the base but is electrically isolated as shown in FIG. 3. In general, an NPN structure is preferable given the higher mobilities of electrons leading to higher frequency response.

Optical gain of a phototransistor is important in determining sensitivity, given that the gain can overcome other noise contributions in order to reach the shot noise limit. These contributions include primarily shot noise from background sources, thermal noise, and electronic amplifier noise such as transimpedance amplifiers (TIAs), and dark current. In conventional phototransistors, high dark current limits the usefulness of such devices. In fact, some conventional devices show improved sensitivity compared to a PIN device only at data rates >~500 Mbit/s due to high dark current coupled with relatively low measured gain (~20).

It may be assumed that the current gain imparts no excess noise as is the case with APDs. This assumption is derived from the fact that the gain is deterministic based on the material parameters and the bias voltage. Here, the excess noise is 1, given the definition of the excess noise of $$\langle Gain^2 \rangle / \langle Gain \rangle^2 \text{ which equals } 1 + \sigma_{Gain}^2 / \langle Gain \rangle^2,$$

and the fact that the variance, $\sigma_{Gain}^2$, is zero.

Many evolving communications architectures are considering, and in many cases incorporating, free-space optical communications links in their technical baseline to take advantage of well-known properties in the areas of increased bandwidth, transmit/receive directionality, and corresponding size/weight/power (SWaP) of flight terminals that provide these combined system enhancements. A predominant feature that determines the viability of these integrated improvements is total lifecycle cost and that directly ties to system complexity, number of components, as well as assembly, integration, and testing in recurring units. Free-space optical communications between air- or space-based platforms combine wide-field-of-view (FOV) spatial acquisition, precision-narrow-FOV line-of-sight (LOS) fine tracking, and high-speed communications functions into a single laser terminal. Most conventional designs demonstrated to date implement these functions using multiple sensor assemblies to tailor performance to allocated requirements for each operational mode. This increases component count and corresponding laser terminal SWaP and cost. Prior attempts to combine laser terminal functions, such as acquisition and tracking or tracking and communications, via shared sensor assemblies typically require sacrifices in performance for each function based on limitations in available sensor hardware. The present disclosure incorporates innovative advances in high-speed heterojunction phototransistor (HPT) arrays to produce a single sensor capable of performing nominal air- and space-based acquisition, tracking, and communications functions. Because of the uniform optical gain without excess noise, HPT arrays using HPTs as described herein are expected to have superior performance compared to PIN photodiodes and avalanche photodiodes (APDs) for receive sensitivity or signal-to-noise required for PAT, communication, or laser radar (ladar) functions. There are also subsequent SWaP improvements in electronics and, potentially, the removal of the point-ahead mirror, if the sensor is used in a look-behind mode. In at least one embodiments, a sensor using an HPT as described herein would be sampled at the data rate, if the FOV is sufficient to encompass the entire jitter spectrum, thus negating the need for a fast steering mirror (FSM) for beam stabilization.

The present disclosure proposes several alternatives to creating pixelated HPTs:

1. Use of an InAlAs emitter layer that is selectively patterned and then oxidized to create a native oxide for isolation. This process can be combined with other processes to isolate the pixels or to passivate surfaces.

2. Use of Si diffusion to create an isolated base with a p-type base layer. This can be implemented either on an etched surface with a solid Si source layer or by ion implantation.

3. Use of a superlattice base layer, InGaAs/InAlAs, that can be selectively patterned and intermixed to create an isolated base layer. This process can be combined with other processing to create a pixelated structure.

The disclosed improvements to conventional phototransistors offer a number of advantages over conventional phototransistors:

1. The use of InAlAs allows a native oxide to be created with essentially a planar structure such as FIG. 5A. This reduces processing time and complexity.

2. The use of Si as a diffusant allows the base to be a p-type, which inherently creates a higher-frequency HPT such as in FIG. 5A.

3. The use of a superlattice has the potential to create slightly lower dark current given the bandgap is essentially increased, given the carrier concentration is a function of exp(-BandgapEnergy/(kB*Temperature)). Also, superlattices can be disordered selectively to create an isolated layer such as in FIG. 6A.

As disclosed herein, a heterojunction phototransistor ("HPT") may be created with an InAlAs emitter layer that is lattice-matched to InP and can be oxidized to create isolated planar mesas. In accordance with one or more embodiments of HPTs disclosed herein, an HPT may be created using Si as a diffusant to create isolated base regions.

In accordance with one or more embodiments of HPTs disclosed herein, an HPT may be created using InGaAs/InAlAs superlattices, either latticed-matched or strained layer to InP, that is used to create a slightly higher bandgap compared to InGaAs lattice-matched to InP. The superlattice alternative reduces dark current and can be selectively disordered to create an isolated base.

In accordance with one or more embodiments of HPTs disclosed herein, an HPT may be created using any combination of the above features.

The present disclosure describes an HPT that is simple to process and define and that can produce near shot-noise limited detection for lasercom and lidar applications. This effect is possible given the high gain results in the shot noise becoming the dominant contributor, negating the effects of thermal noise, dark current, or other noise sources. For lasercom, this invention allows the use of one pixelated detector for all acquisition, tracking, and communications functions with high receive sensitivity. These functions typically incorporate separate receive sensors.

Figure 4:
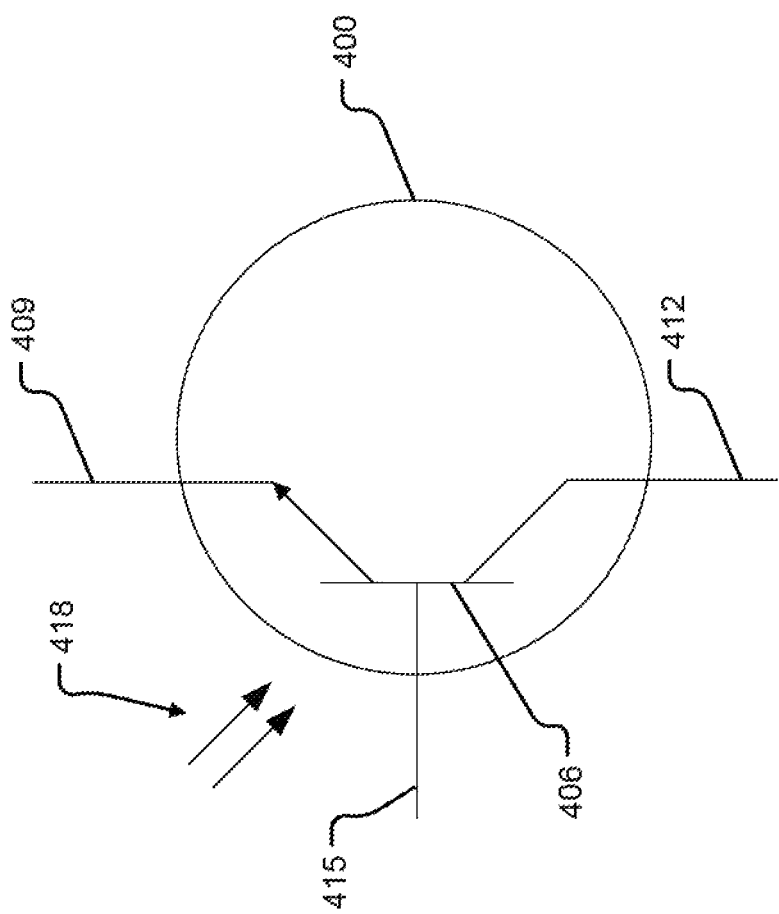
FIG. 4 is a circuit diagram of a phototransistor in accordance with one or more of the embodiments described herein.

Photodiodes are semiconductor devices which may be used to convert light into electrical current. Current is generated by a photodiode as photons from light sources are absorbed by the photodiode. As illustrated in FIG. 4, a phototransistor 400 may comprise a base 406 with a base connection 415. A phototransistor 400 may also comprise an emitter 409 and a collector 412. When light 418 contacts the phototransistor 400, current may be generated.

A major issue with many photodiodes is response time. Typically, a photodiode with a larger surface area has a slower response time compared with similar photodiodes with smaller amounts of surface area.

Many photodiodes use a PIN junction which may increase the speed of response of the photodiode as compared with using a p-n junction.

A PIN diode uses an undoped intrinsic semiconductor region between a p-type semiconductor region and an n-type semiconductor region. The p- and n-type semiconductor regions may be used for ohmic contacts and may be relatively heavily doped.

Current created by light hitting the photodiode may be described as photocurrent. Current generated by a photodiode in the absence of light may be described as dark current. The total current through a photodiode is the sum of dark current and photocurrent. There is a need to create a photodiode with minimal to no dark current.

Phototransistors are light-sensitive transistors. One type of phototransistor is a photo-bipolar transistor. Some phototransistors may be described as heterojunction phototransistors ("HPTs"). A heterojunction is created when differing semiconductor materials for the emitter and base regions are used. HPTs are often used in modern circuits requiring high speed, for example radio-frequency systems, and in systems requiring a high-power efficiency such as RF power amplifiers.

HPTs may also be used for laser communication systems. In some embodiments of the present disclosure, a single pixelated detector may be used for all acquisition, tracking, and communication functions of a laser communication system with high receive sensitivity. Laser communication systems using conventional HPTs, however, must incorporate separate receive sensors. In some embodiments of the present disclosure, an HPT may be used in a LIDAR system.

In some embodiments, an emitter layer of a phototransistor may comprise an InAlAs material. Using InAlAs for an emitter layer, a native oxide may be created with essentially a planar structure. When a native oxide with an essentially planar structure is used in an HPT, processing time and complexity may be reduced. In some embodiments, an InAlAs emitter layer may be lattice-matched to InP. In some embodiments, the emitter layer may be oxidized to create isolated planar mesas. In some embodiments, native oxide may be used to create isolation.

In some embodiments, a base layer of an HPT may comprise a superlatticed base layer. For example, a base player comprising InGaAs and InAlAs superlatticed may be used. Using an InGaAs/InAlAs superlattice base in an HPT provides a potential of creating slightly lower dark current as the bandgap of the HPT is essentially increased. Also, superlattices can be disordered selectively to create an isolated layer. In some embodiments, a superlattice base layer may be lattice-matched or strained layer to InP. A superlattice base may be used to create a slightly higher bandgap as compared to an HPT with a base of InGaAs lattice-matched to InP. Furthermore, superlattice alternative reduces dark current and can be selectively disordered to create an isolated base.

A superlatticed base layer may be combined with other processing to create a pixelated structure. In some embodiments, silicon may be used as a diffusant. Using silicon as a diffusant allows the base of an HPT to be a p-type base, which inherently creates a higher-frequency HPT. Also, when silicon is used as a diffusant, isolated base regions may be created.

In some embodiments of the present disclosure, a phototransistor may comprise a capping layer. The capping layer may be of a material such as indium gallium arsenide ("InGaAs"). In some embodiments the InGaAs may be n-type doped.

In some embodiments, a phototransistor may comprise an n-type emitter of a material such as InAlAs, a p-type base of a material such as InGaAs, a superlatticed base such as an InGaAs/InAlAs Superlattice (SL) P base, an n-type collector of a material such as InGaAs, or some combination thereof.

In some embodiments, a phototransistor may comprise a superlatticed collector. For example, a collector may comprise superlatticed InGaAs and InAlAs. Such a collector may be an n-type collector.

In some embodiments, a phototransistor may comprise an InP N buffer and substrate and/or an $Si_3N_4$ AR coating. A silicon diffusion process may be used to create an isolated base with a p-type base layer. Silicon diffusion may be implemented, for example, on an etched surface with a solid Si source layer or by ion implantation.

Figure 5A:
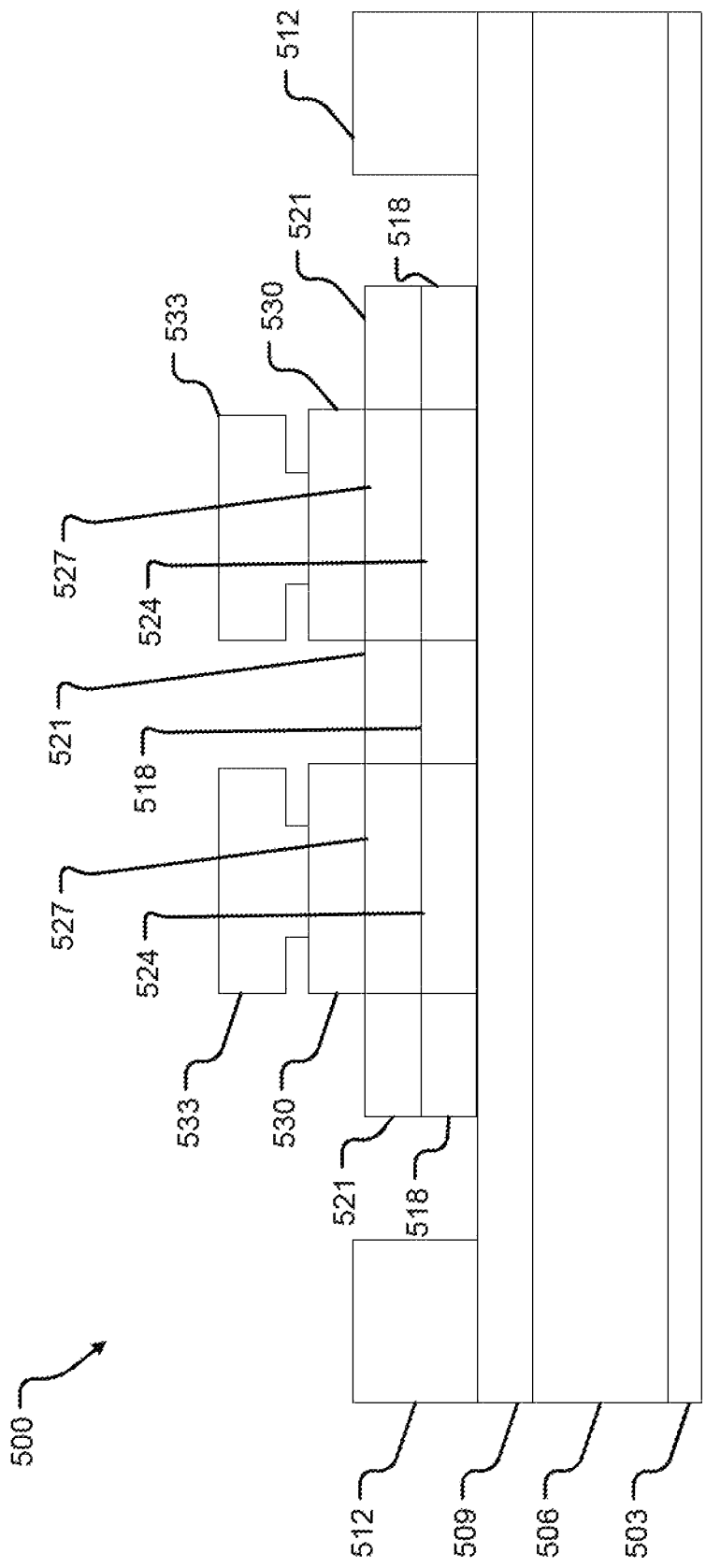
FIG. 5A is a block diagram of an embodiment of a phototransistor in accordance with one or more of the embodiments described herein.

As illustrated in FIG. 5A, a heterojunction phototransistor ("HPT") 500 may in some embodiments comprise an $Si_3N_4$ AR coating 503, an InP N buffer and substrate 506, an InGaAs N collector layer 509, metal electrical contacts 512, silicon implantation 518, native oxide 521, one or more InGaAs P base portions 524, one or more InAlAs N emitter portions 527, one or more InGaAs N+ caps 530, and one or more upper metal electrical contacts 527. Such an HPT 500 as illustrated in FIG. 5A may be formed by a process described below and illustrated in FIG. 5B.

Figure 5B:
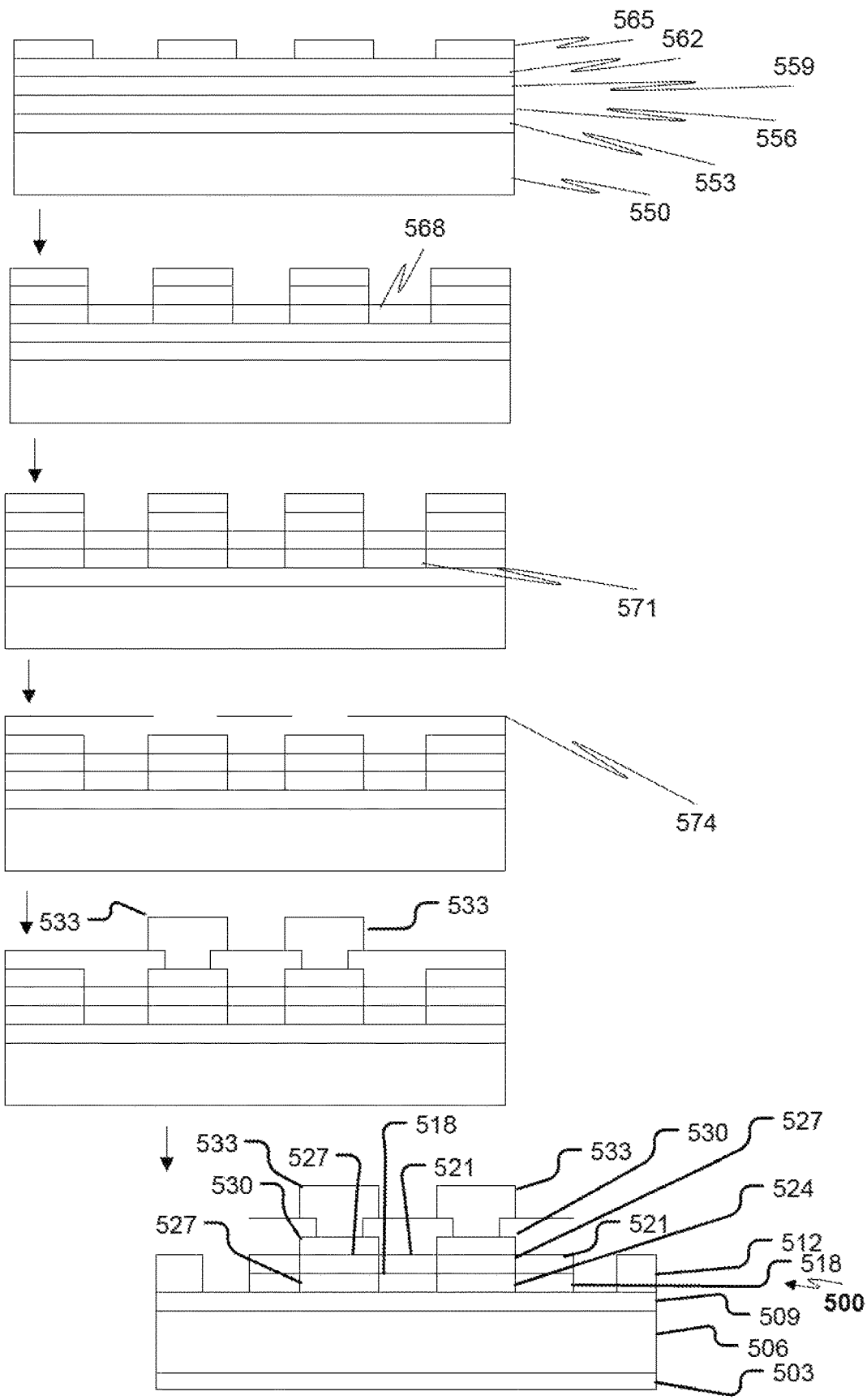
FIG. 5B is a block diagram of a method of creating a phototransistor in accordance with one or more of the embodiments described herein.

As illustrated in FIG. 5B, an HPT 500 phototransistor such as that illustrated in FIG. 5A may be created using a process beginning with forming a buffer and substrate 550. In some embodiments, the buffer and substrate 550 may comprise an InP N buffer and substrate. Next, a first layer 553 may be formed on the buffer and substrate. The first layer 553 may comprise an InGaAs N material and may be used as a collector of the phototransistor being formed.

A second layer 556 may be formed on the first layer. The second layer 556 may comprise an InGaAs P material and may be used as a plurality of bases of the phototransistor being formed. A third layer 559 may be formed on the second layer. The third layer 559 may comprise an InAlAs N material and may be used as a plurality of emitters of the phototransistor.

A fourth layer 562 may be formed on the third layer. The fourth layer 562 may comprise an InGaAs N+ material and may be used as a plurality of caps of the phototransistor. A pattern mesa layer 565 may be formed on the fourth layer. The pattern mesa layer 565 may be a series of SiNx materials deposited on the fourth layer. The fourth layer 562 may be etched using the pattern mesa layer. By etching the fourth layer, a plurality of caps may be created. The third layer may be oxidized to create a plurality of emitters. In some embodiments, a native oxide 568 may be formed separating the plurality of emitters. Using ion implantation a plurality of Si implantations 571 may be formed in the second layer. The Si implantations 571 may be used to separate portions of the second layer which may create a plurality of bases separated by Si. In some embodiments, however, the Si implantation step may be skipped and a phototransistor may be formed without the Si implantations 571.

Portions of the SiNx may be etched using a metal pattern 574 to create a direct opening to the caps. A metal pattern with openings for forming metal contacts may be set on the SiNx layer. Metal may be deposited onto the caps creating a plurality of electrical contacts 533 for the phototransistor. In some embodiments, the metal may an N metal and may comprise one or more of Ti, Pt, and Au.

Portions of the pattern of metal and/or the deposited metal may be etched away to create outer electrical contacts. Such outer electrical contacts may be in electrical contact with portions of the first layer. A coating may be formed on the substrate and buffer. The coating may comprise a $Si_3N_4$ AR coating.

Figure 6A:
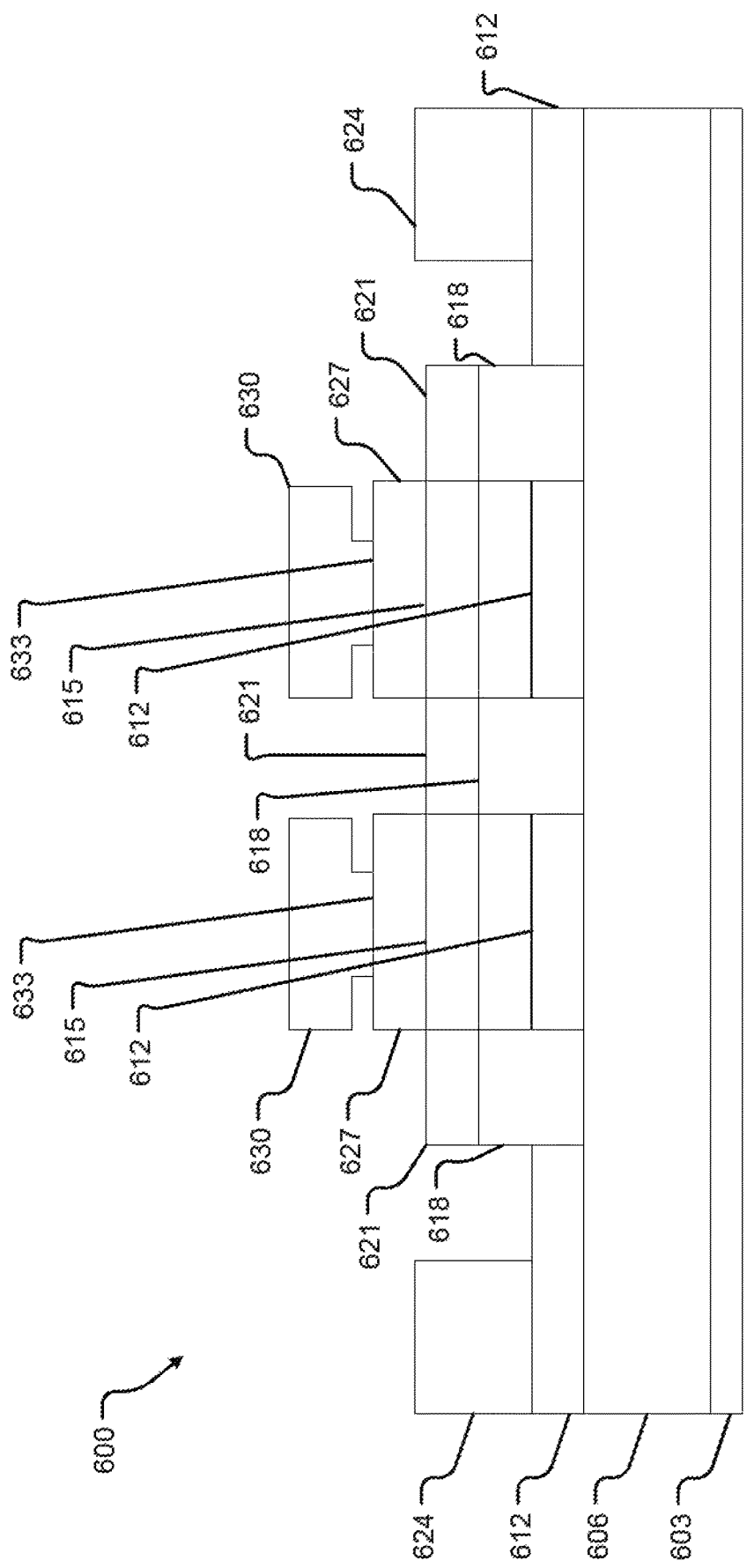
FIG. 6A is a block diagram of an embodiment of a phototransistor in accordance with one or more of the embodiments described herein.

As illustrated in FIG. 6A, an HPT 600 may in some embodiments comprise an $Si_3N_4$ AR coating 603, an InP N buffer and substrate 606, one or more InGaAs N collectors 612, metal electrical contacts 624, one or more regions of intermixed InGaAlAs 618 which may be created using silicon diffusion, native oxide 621, one or more InGaAs/InAlAs super lattice N collector portions 612, one or more InGaAs/InAlAs superlattice P base portions 615, one or more InGaAs N+ caps 633, and one or more upper metal electrical contacts 630. Such an HPT 600 as illustrated in FIG. 6A may be formed by a process described below and illustrated in FIG. 6B.

Figure 6B:
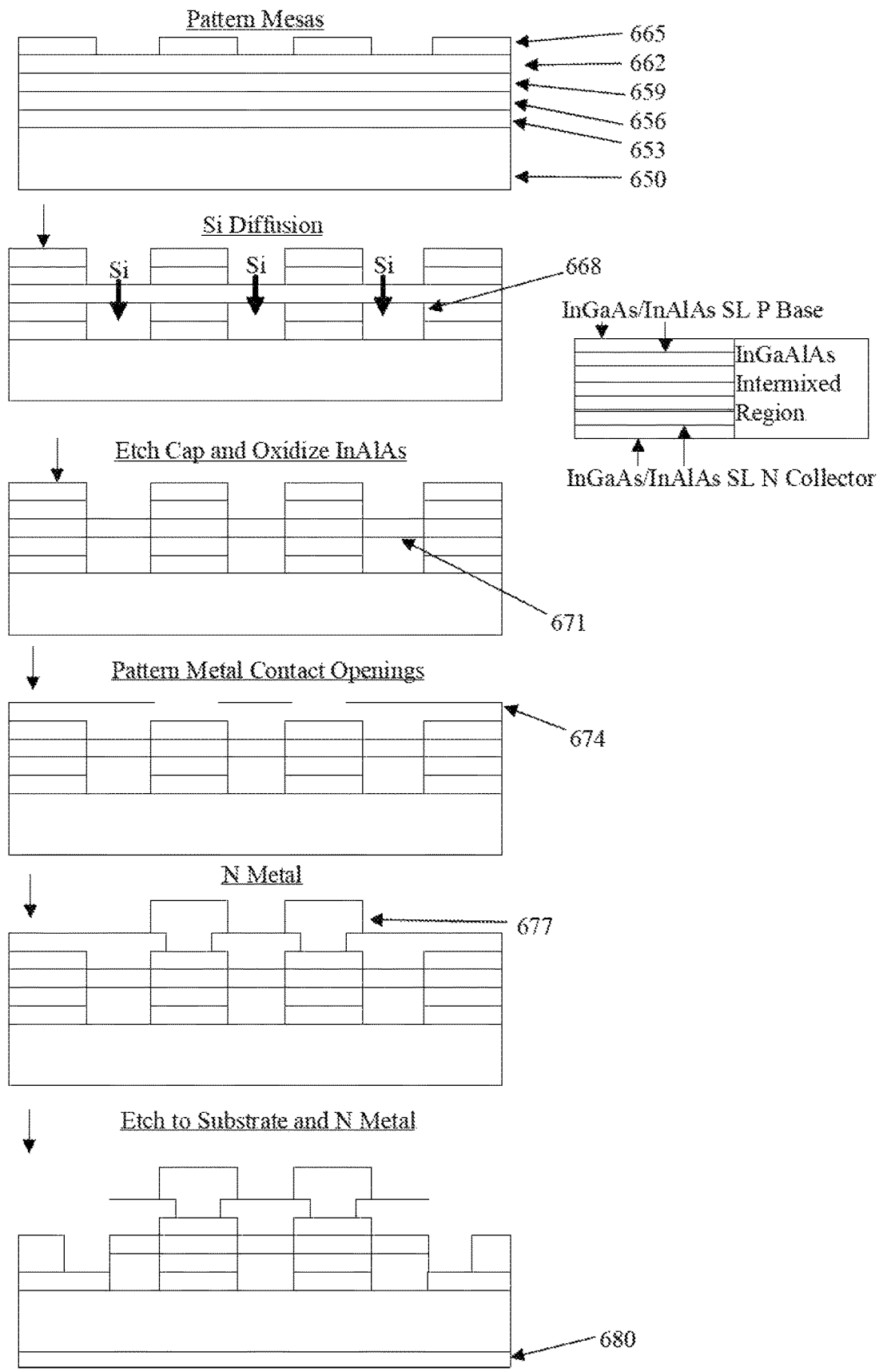
FIG. 6B is a block diagram of a method of creating a phototransistor in accordance with one or more of the embodiments described herein.

As illustrated in FIG. 6B, an HPT as illustrated in 6A may be formed using a processing beginning by forming a buffer and substrate 650. In some embodiments, the buffer and substrate 650 may comprise an InP N buffer and substrate.

Next, a first layer 653 may be formed on the buffer and substrate. The first layer 653 may comprise one or more of an InGaAs N material and an InAlAs SL N material. At least portions of the first layer 653 may be used as one or more collectors of the phototransistor being formed.

A second layer 656 may be formed on the first layer 653. The second layer 656 may comprise one or more of InGaAs P material and InAlAs SL P material. At least portions of the second layer 656 may be used as one or more bases of the phototransistor being formed. A third layer 659 may be formed on the second layer 656. The third layer 659 may comprise an InAlAs N material. At least portions of the third layer 656 may be used as one or more emitters of the phototransistor being formed. A fourth layer 662 may be formed on the third layer 659. The fourth layer 662 may comprise an InGaAs N+ material. At least portions of the fourth layer 662 may be used as one or more caps in the phototransistor being formed. A fifth layer 665 comprising pattern mesas of SiNx may be deposited onto the fourth layer. The fifth layer 665 may be designed such that openings between the pattern mesas are shaped to match spacing between elements of the other layers which will be formed in the following steps.

A process of silicon diffusion may be used to disorder superlattice portions of the first and second layers 653, 656. The superlattice portions of the first and second layers 653, 656 may match the shape of the pattern mesas of the fifth layer 665. The silicon diffusion process may create an intermixed region of a material 668 such as InGaAlAs between the superlattice portions of the first and second layers 653, 656. The superlattice portions of the first 653 and second layers 656 may act as collectors and bases, respectively, of the phototransistor being created.

Portions of the fourth layer 662 may be etched or otherwise removed to create separations between portions of the fourth layer 662. The remaining portions of the fourth layer 662 may form caps of the phototransistor.

An oxidation process may be used to remove portions of the third layer 659. The removed portions of the third layer 659 may match the shape and arrangement of the openings in the pattern mesa layer. In some embodiments, the removed portions of the third layer 659 may be replaced with or converted into native oxide 671. In such embodiments, the native oxide 671 may separate the remaining portions of the third layer 659. One or more of the remaining portions of the third layer 659 may be configured to operate as emitters of the phototransistor being created.

A pattern of metal 674 may be set over the fifth layer 665. Openings in the pattern of metal 674 may be arranged over one or more of the remaining portions of the fourth layer 662.

A metal 677 may be deposited onto the pattern of metal 674. The deposited metal may be an N-type metal 677 and may comprise a material such as Ti, Pt, and/or Au. The deposited metal 677 may make electrical contact with the fourth layer and may act as one or more electrical contacts for the phototransistor being created.

Portions of the pattern of metal and/or the deposited metal may be etched away to create outer electrical contacts. Such outer electrical contacts may be in electrical contact with portions of the first layer. Finally, the phototransistor may optionally be coated with a material such as an $Si_3N_4$ AR coating 680. The optional coating may be on a surface of the buffer and substrate opposite that of the first layer.

Figure 7:
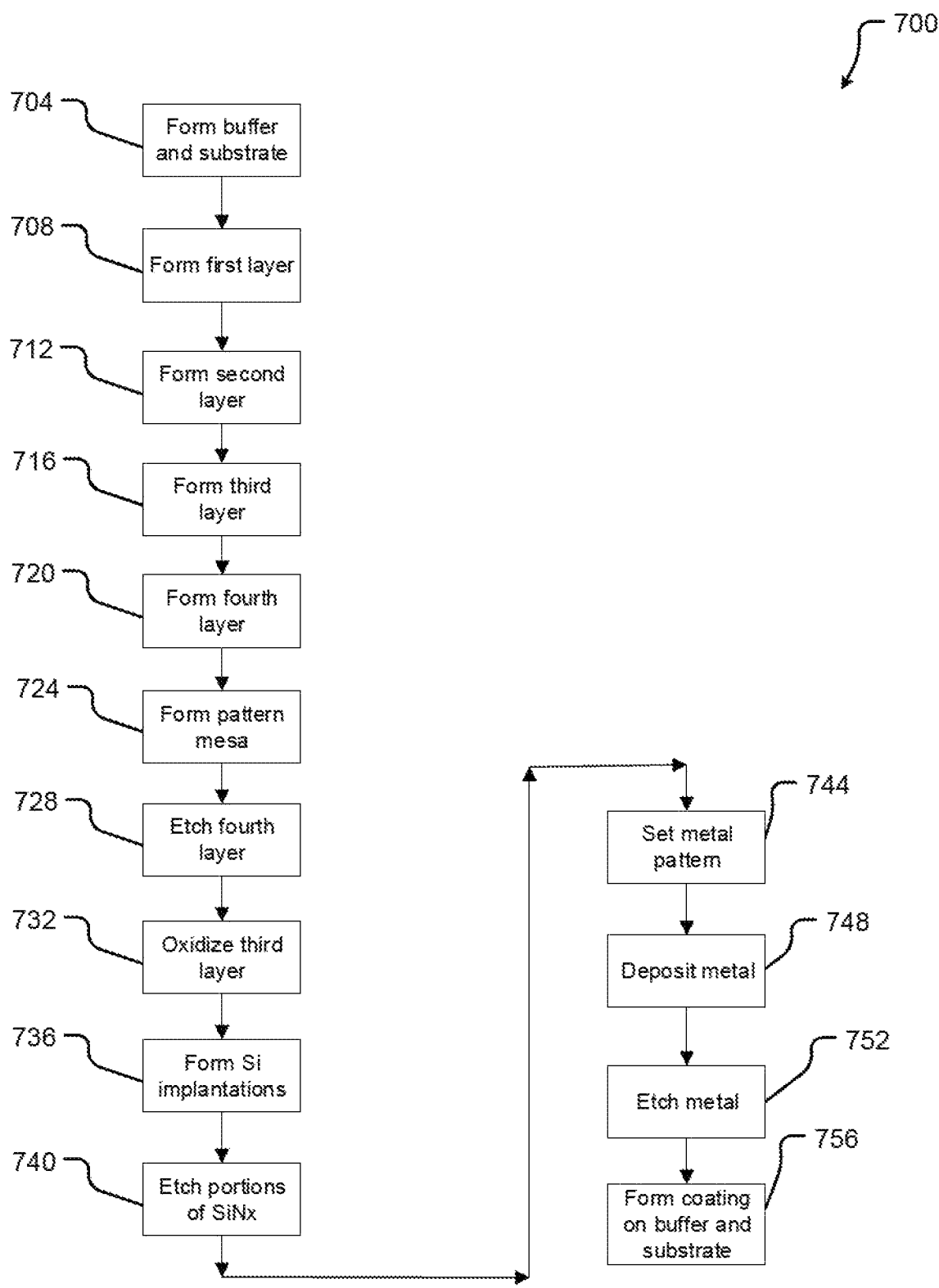
FIG. 7 is a flowchart of a method of creating a phototransistor in accordance with one or more of the embodiments described herein.

In certain aspects of the present disclosure, a phototransistor such as that illustrated in FIG. 5A may be created using a method 700 as illustrated in FIG. 7. The method 700 may begin by forming a buffer and substrate in step 704. In some embodiments, the buffer and substrate may comprise an InP N buffer and substrate.

Next, a first layer may be formed on the buffer and substrate in step 708. The first layer may comprise an InGaAs N material and may be used as a collector of the phototransistor being formed by the method 700.

A second layer may be formed on the first layer in step 712. The second layer may comprise an InGaAs P material and may be used as a plurality of bases of the phototransistor being formed by the method 700.

A third layer may be formed on the second layer in step 716. The third layer may comprise an InAlAs N material and may be used as a plurality of emitters of the phototransistor being formed by the method 700.

A fourth layer may be formed on the third layer in step 720. The fourth layer may comprise an InGaAs N+ material and may be used as a plurality of caps of the phototransistor being formed by the method 700.

A pattern mesa layer may be formed on the fourth layer in step 724. The pattern mesa layer may be a series of SiNx materials deposited on the fourth layer.

In step 728, the fourth layer may be etched using the pattern mesa layer formed in step 724. By etching the fourth layer, a plurality of caps may be created.

In step 732, the third layer may be oxidized to create a plurality of emitters. In some embodiments, a native oxide may be formed separating the plurality of emitters.

In step 736, using ion implantation a plurality of Si implantations may be formed in the second layer. The Si implantations may be used to separate portions of the second layer which may create a plurality of bases separated by Si. In some embodiments, however, the Si implantation step 736 may be skipped and a phototransistor may be formed without the Si implantation.

In step 740, portions of the $SiN_x$ may be etched using the metal pattern to create a direct opening to the caps created in step 728.

In step 744, a metal pattern with openings for forming metal contacts may be set on the $SiN_x$ layer.

In step 748, metal may be deposited onto the caps creating a plurality of electrical contacts for the phototransistor. In some embodiments, the metal may an N metal and may comprise one or more of Ti, Pt, and Au.

In step 752, portions of the pattern of metal and/or the deposited metal may be etched away to create outer electrical contacts. Such outer electrical contacts may be in electrical contact with portions of the first layer.

In step 756, a coating may be formed on the substrate and buffer. The coating may comprise a $Si_3N_4$ AR coating.

Figure 8:
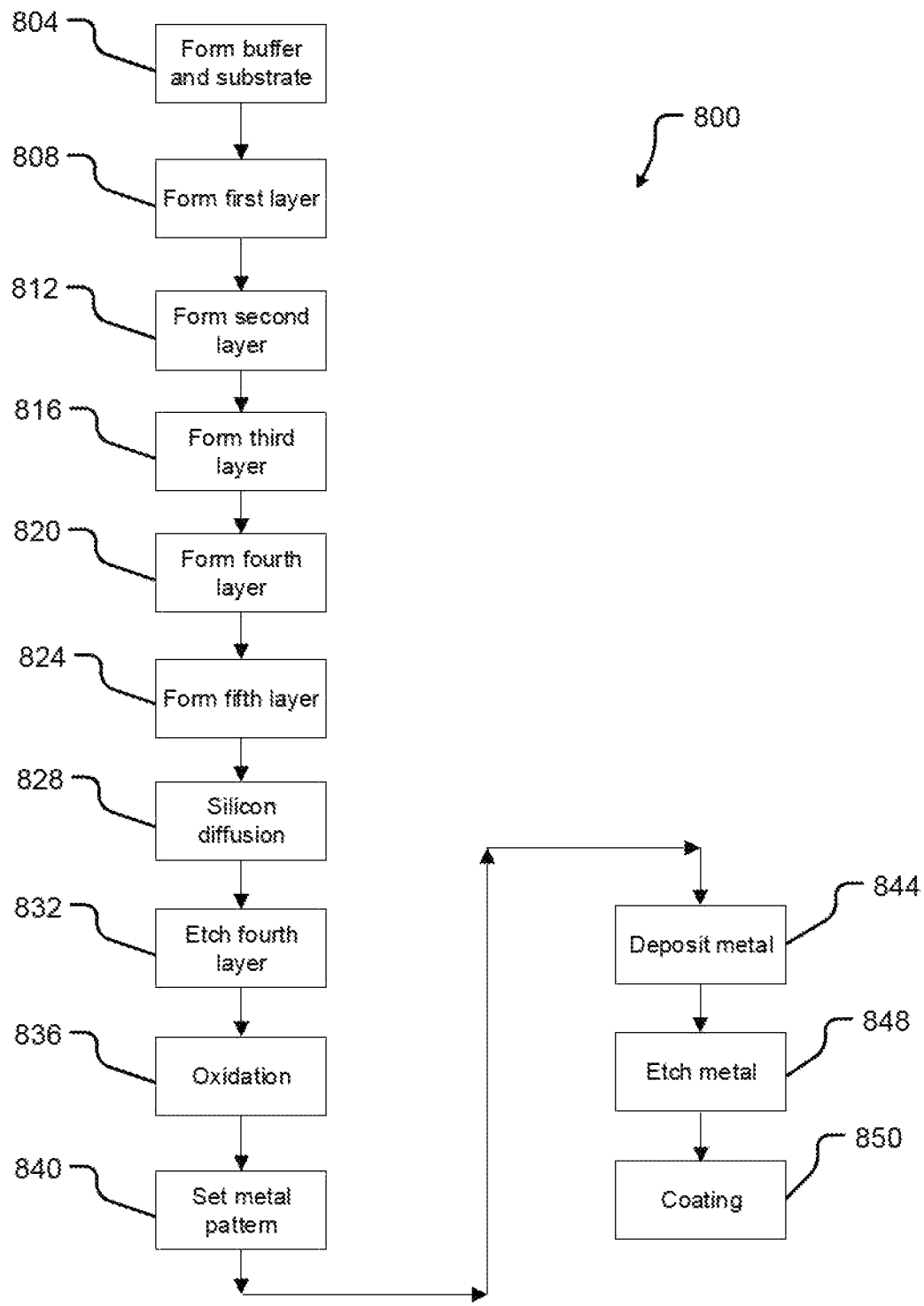
FIG. 8 is a flowchart of a method of creating a phototransistor in accordance with one or more of the embodiments described herein.

In certain aspects of the present disclosure, a phototransistor such as that illustrated in FIG. 6A may be created using a method 800 as illustrated in FIG. 8. The method 800 may begin by forming a buffer and substrate in step 804. In some embodiments, the buffer and substrate may comprise an InP N buffer and substrate.

Next, a first layer may be formed on the buffer and substrate in step 808. The first layer may comprise one or more of an InGaAs N material and an InAlAs SL N material. At least portions of the first layer may be used as one or more collectors of the phototransistor being formed by the method 800.

A second layer may be formed on the first layer in step 812. The second layer may comprise one or more of InGaAs P material and InAlAs SL P material. At least portions of the second layer may be used as one or more bases of the phototransistor being formed by the method 800.

In step 816, a third layer may be formed on the second layer. The third layer may comprise an InAlAs N material. At least portions of the third layer may be used as one or more emitters of the phototransistor being formed by the method 800.

In step 820, a fourth layer may be formed on the third layer. The fourth layer may comprise an InGaAs N+ material. At least portions of the fourth layer may be used as one or more caps in the phototransistor being formed by the method 800.

In step 824, a fifth layer comprising pattern mesas of $SiN_x$ may be deposited onto the fourth layer. The fifth layer may be designed such that openings between the pattern mesas are shaped to match spacing between elements of the other layers which will be formed in the following steps.

In step 828, a process of silicon diffusion may be used to disorder superlattice portions of the first and second layers. The superlattice portions of the first and second layers may match the shape of the pattern mesas of the fifth layer. The silicon diffusion process may create an intermixed region of a material such as InGaAlAs between the superlattice portions of the first and second layers. The superlattice portions of the first and second layers may act as collectors and bases, respectively, of the phototransistor being created in the method 800.

In step 832, portions of the fourth layer may be etched or otherwise removed to create separations between portions of the fourth layer. The remaining portions of the fourth layer may form caps of the phototransistor.

In step 836, an oxidation process may be used to remove portions of the third layer. The removed portions of the third layer may match the shape and arrangement of the openings in the pattern mesa layer. In some embodiments, the removed portions of the third layer may be replaced with or converted into native oxide. In such embodiments, the native oxide may separate the remaining portions of the third layer. One or more of the remaining portions of the third layer may be configured to operate as emitters of the phototransistor being created by the method 800.

In step 840, a pattern of metal may be set over the fifth layer. Openings in the pattern of metal may be arranged over one or more of the remaining portions of the fourth layer.

In step 844, a metal may be deposited onto the pattern of metal. The deposited metal may be an N-type metal and may comprise a material such as Ti, Pt, and/or Au. The deposited metal may make electrical contact with the fourth layer and may act as one or more electrical contacts for the phototransistor being created by the method 800.

In step 848, portions of the pattern of metal and/or the deposited metal may be etched away to create outer electrical contacts. Such outer electrical contacts may be in electrical contact with portions of the first layer.

In step 852, the phototransistor may optionally be coated with a material such as an $Si_3N_4$ AR coating. The optional coating may be on a surface of the buffer and substrate opposite that of the first layer.

Any of the steps, functions, and operations discussed herein can be performed continuously and automatically.

The exemplary systems and methods of this disclosure have been described in relation to a heterojunction phototransistor. However, to avoid unnecessarily obscuring the present disclosure, the preceding description omits a number of known structures and devices. For example, the above methods may be used to create any other type of transistor. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a hetero-junction phototransistor comprising: a first layer comprising an InP N buffer and substrate; a second layer comprising an InGaAs N collector on the InP N buffer and substrate; a plurality of InGaAs P bases on the InGaAs N collector layer; a plurality of InAlAs N emitters, wherein each emitter of the plurality of InAlAs N emitters is on a different base of the plurality of InGaAs P bases; a plurality of InGaAs N+ caps, wherein each cap of the plurality of InGaAs N+ caps is on a different emitter of the plurality of InAlAs N emitters; and one or more electrical contacts, wherein each of the one or more electrical contacts is on a different cap of the plurality of InGaAs N+ caps.

Aspects of the above HPT include the HPT further comprising a $SI_3N_4$ AR coating.

Aspects of the above HPT include wherein the $Si_3N_4$ AR coating is in contact with the InP buffer and substrate.

Aspects of the above HPT include the HPT further comprising further comprising a Silicon implantation between the native oxide layer and the InGaAs N collector.

Aspects of the above HPT include wherein the silicon implantation is between two of the plurality of InGaAs P bases.

Aspects of the above HPT include wherein the plurality of InAlAs N emitters are separated by native oxide.

Aspects of the above HPT include wherein the electrical contacts comprise one or more of Ti, Pt, and Au.

Embodiments include a hetero-junction phototransistor comprising: a first layer comprising an InP N buffer and substrate; a second layer comprising one or more collectors on the InP N buffer and substrate, wherein the one or more collectors comprise one or more of InGaAs N collectors and InAlAs SL N collectors; a plurality of bases on the InGaAs N collectors, wherein the plurality of bases comprise one or more of InGaAs P bases and InAlAs SL P bases; a plurality of InAlAs N emitters, wherein each emitter of the plurality of InAlAs N emitters is on a different base of the plurality of InGaAs P bases; a plurality of InGaAs N+ caps, wherein each cap of the plurality of InGaAs N+ caps is on a different emitter of the plurality of InAlAs N emitters; and one or more electrical contacts, wherein each of the one or more electrical contacts is on a different cap of the plurality of InGaAs N+ caps, wherein a plurality of superlattice base and collectors are comprised by a different base of the plurality of bases and a different collector of the plurality of collectors.

Aspects of the above HPT include the HPT further comprising a $Si_3N_4$ AR coating.

Aspects of the above HPT include wherein the $Si_3N_4$ AR coating is in contact with the InP buffer and substrate.

Aspects of the above HPT include wherein each of the superlattice base and collectors are separated by an InGaAIAs intermixed region.

Aspects of the above HPT include wherein the plurality of InAlAs N emitters are separated by native oxide.

Aspects of the above HPT include wherein the electrical contacts comprise one or more of Ti, Pt, and Au.

Aspects of the above HPT include wherein the electrical contacts are separated by $SiN_x$.

Embodiments include a method of forming a hetero-junction phototransistor, the method comprising: forming a first layer comprising an InP N buffer and substrate; depositing a second layer on the first layer, the second layer comprising one or more of InGaAs N collectors and InAlAs SL N on the InP N buffer and substrate; depositing a third layer on the second layer, the third layer comprising one or more of InGaAs P bases and InAlAs SL P on the second layer; depositing a fourth layer on the third layer, the fourth layer comprising InAlAs N; depositing a fifth layer on the fourth layer, the fifth layer comprising InGaAs N+; depositing a sixth layer on the fifth layer, the sixth layer comprising a plurality of $SiN_x$ mesas patterned on the fifth layer; using Si diffusion to create superlattice collectors and bases from the second and third layers; creating a plurality of InGaAs N+ caps from the fifth layer; creating a plurality of emitters from the fourth layer; using pattern metal contact openings to deposit N metal on the plurality of caps, wherein the N metal comprises a plurality of electrical contacts, wherein each electrical contact of the plurality of electrical contacts is on a different cap of the plurality of InGaAs N+ caps; and etching the pattern metal to form a hetero-junction phototransistor.

Aspects of the above method include the method further comprising coating the hetero-junction phototransistor with a $Si_3N_4$ AR coating.

Aspects of the above method include wherein the $Si_3N_4$ AR coating is in contact with the InP buffer and substrate Aspects of the above method include wherein each of the superlattice base and collectors are separated by an InGaAIAs intermixed region.

Aspects of the above method include wherein the plurality of InAlAs N emitters are separated by native oxide.

Aspects of the above method include wherein the electrical contacts are separated by SiNx.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed is:

1. A hetero-junction phototransistor comprising:
   a first layer comprising an N-type InP buffer and a substrate;
   a second layer comprising a plurality of collectors, the plurality of collectors comprising an N-type InGaAs collector on the N-type InP buffer and the substrate;
   a plurality of P-type InGaAs bases on the second layer;
   a plurality of N-type InAlAs emitters, wherein each N-type InAlAs emitter of the plurality of N-type InAlAs emitters is on a different P-type InGaAs base of the plurality of P-type InGaAs bases;
   a plurality of $N^+$-type InGaAs caps, wherein each $N^+$-type InGaAs cap of the plurality of $N^+$-type InGaAs caps is on a different N-type InAlAs emitter of the plurality of N-type InAlAs emitters;
   one or more electrical contacts, wherein each of the one or more electrical contacts is on a different $N^+$-type InGaAs cap of the plurality of $N^+$-type InGaAs caps, wherein a plurality of superlattice bases and superlattice collectors are comprised by a different P-type InGaAs base of the plurality of P-type InGaAs bases and a different collector of the plurality of collectors; and
   a silicon implantation region between a native oxide layer and the N-type InGaAs collector; wherein the silicon implantation region is between two of the plurality of P-type InGaAs bases.

2. The hetero-junction phototransistor of claim 1, further comprising a $Si_3N_4$ anti-reflection coating.

3. The hetero-junction phototransistor of claim 2, wherein the $Si_3N_4$ anti-reflection coating is in contact with the N-type InP buffer and the substrate.

4. The hetero-junction phototransistor of claim 1, wherein each of the plurality of N-type InAlAs emitters are separated by a native oxide.

5. The hetero-junction phototransistor of claim 1, wherein the electrical contacts comprise one or more of Ti, Pt, and Au.

6. A hetero junction phototransistor comprising:
   a first layer comprising an N-type InP buffer and a substrate;
   a second layer comprising a plurality of collectors on the N-type InP buffer and the substrate, wherein the plurality of collectors comprises one or more of an N-type InGaAs collector and an N-type InAlAs collector;
   a plurality of bases on the plurality of collectors, wherein the plurality of bases comprises one or more of a P-type InGaAs base and a P-type InAlAs base;
   a plurality of N-type InAlAs emitters, wherein each N-type InAlAs emitter of the plurality of N-type InAlAs emitters is on a different base of the plurality of bases;
   a plurality of $N^+$-type InGaAs caps, wherein each $N^+$-type InGaAs cap of the plurality of $N^+$-type InGaAs caps is on a different N-type InAlAs emitter of the plurality of $N^+$-type InAlAs emitters; and
   one or more electrical contacts, wherein each of the one or more electrical contacts is on a different $N^+$-type InGaAs cap of the plurality of $N^+$-type InGaAs caps, wherein a plurality of superlattice bases and superlattice collectors are comprised by a different base of the plurality of bases and a different collector of the plurality of collectors, wherein each of the plurality of N-type InAlAs emitters are separated by a native oxide, wherein the electrical contacts are separated by silicon nitride.

7. The hetero-junction phototransistor of claim 6, further comprising a $Si_3N_4$ anti-reflective coating.

8. The heterojunction phototransistor of claim 7, wherein the $Si_3N_4$ anti-reflective coating is in contact with the N-type InP buffer and the substrate.

9. The hetero-junction phototransistor of claim 6, wherein each of the superlattice bases and superlattice collectors are separated by an InGaAlAs intermixed region.

10. The hetero-junction phototransistor of claim 6, wherein the electrical contacts comprise one or more of Ti, Pt, and Au.

* * * * *